(12) United States Patent
Xia

(10) Patent No.: US 7,267,726 B2
(45) Date of Patent: Sep. 11, 2007

(54) METHOD AND APPARATUS FOR REMOVING POLYMER RESIDUE FROM SEMICONDUCTOR WAFER EDGE AND BACK SIDE

(75) Inventor: Changfeng Xia, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 104 days.

(21) Appl. No.: 10/420,228

(22) Filed: Apr. 22, 2003

(65) Prior Publication Data

US 2004/0211442 A1 Oct. 28, 2004

(51) Int. Cl.
*C23G 1/02* (2006.01)
(52) U.S. Cl. ............................................. 134/3; 134/33
(58) Field of Classification Search .................... 134/3, 134/28, 33, 34, 184, 186, 149, 153, 157; 15/102; 216/13, 57
See application file for complete search history.

(56) References Cited

U.S. PATENT DOCUMENTS

| | | | | |
|---|---|---|---|---|
| 4,603,867 A | * | 8/1986 | Babb et al. | 279/3 |
| 4,999,320 A | * | 3/1991 | Douglas | 438/715 |
| 5,762,708 A | * | 6/1998 | Motoda et al. | 118/52 |
| 5,763,375 A | * | 6/1998 | Kezuka et al. | 510/175 |
| 6,132,522 A | * | 10/2000 | Verhaverbeke et al. | 134/26 |
| 6,149,828 A | * | 11/2000 | Vaartstra | 216/57 |
| 6,179,978 B1 | * | 1/2001 | Hirsh et al. | 204/281 |
| 6,230,609 B1 | * | 5/2001 | Bender et al. | 92/99 |
| 6,370,972 B1 | * | 4/2002 | Bomber et al. | 73/863.23 |
| 6,435,200 B1 | * | 8/2002 | Langen | 134/99.1 |
| 6,517,697 B1 | * | 2/2003 | Yamagata | 205/147 |
| 6,594,847 B1 | * | 7/2003 | Krusell et al. | 15/102 |
| 6,799,589 B2 | * | 10/2004 | Inagaki | 134/84 |
| 2002/0035762 A1 | * | 3/2002 | Okuda et al. | 15/77 |
| 2002/0066717 A1 | * | 6/2002 | Verhaverbeke et al. | 216/13 |
| 2003/0093917 A1 | * | 5/2003 | DiBello | 34/443 |
| 2003/0113478 A1 | * | 6/2003 | Dang et al. | 427/535 |

\* cited by examiner

*Primary Examiner*—Michael Barr
*Assistant Examiner*—Sarah E. Husband
(74) *Attorney, Agent, or Firm*—Jacqueline J. Garner; W. James Brady, III; Frederick J. Telecky, Jr.

(57) ABSTRACT

A method for cleaning a semiconductor device has the steps of securing a wafer (16) with a modified chuck (11) and applying a cleaning solution (18) to the backside (20) of the wafer (16). The cleaning solution (18) is formulated to remove PTFE from the wafer (16). The cleaning solution (18) is applied to the edge (14) of the wafer (16) because of the characteristics of the modified chuck (11) to remove PTFE impurities that gather on the edge (14) of the wafer (16).

17 Claims, 4 Drawing Sheets

METHOD AND APPARATUS FOR REMOVING POLYMER RESIDUE FROM SEMICONDUCTOR WAFER EDGE AND BACK SIDE

TECHNICAL FIELD OF THE INVENTION

The present invention relates to fabricating electronic devices and more particularly to a method and apparatus for holding and cleaning a semiconductor wafer that uses a backside clean apparatus with modified chemistries and modified back side clean apparatus to remove polymeric residues on the wafer edge (both front side and back side) and the wafer back side.

BACKGROUND OF THE INVENTION

Advances in electronic devices generally include reducing the size of the components that form integrated circuits. With smaller circuit components, the value of each unit area (real estate) of a semiconductor wafer becomes higher because of the ability to use more of the wafer area for the integrated circuit components. To properly form an integrated circuit that employs a much higher percentage of useable wafer area, it is critical that contaminants on the semiconductor wafer surface be reduced to levels that are commercially acceptable. In integrated circuit fabrication, a process known as chemical mechanical polish (hereinafter "CMP") has become popular and is used to achieve flat surface for photolithography patterning. A conventional CMP system incorporates numerous elements for maneuvering the semiconductor wafer such as wafer boats, load cassettes, robotic arms, carriers, and other transportation means. During the traditional CMP process, the semiconductor wafer is exposed to polytetrafluoroethylene (PTFE) or Teflon® manufactured by DuPont and other plastic materials used to form the wafer boats, carriers and handlers and can generate polymeric defects after being exposed to chemicals during the post-CMP cleans, as well as the post Via, Trench and Etch Stop etch cleans. Although the carbon fluorine (C:F) bond found in polytetrafluoroethylene is a particularly strong bond, the PTFE will eventually break down from the physical handling in conjunction with the chemicals used during conventional CMP processes. In addition, wafer handling can also cause physical abrasion between the semiconductor wafer and the PTFE coated carrier devices.

An additional problem is the front edge of the semiconductor wafer may be contaminated subsequently with these defects by contacting the wafer boats or wafer handlers. Importantly, these polymeric defects may be disturbed and scattered all over the front wafer surface during the down stream processing. These defects will then be buried by the following dielectric layered depositions which can cause significant yield loss at each level of interconnection.

In addition, current back wafer cleaning processes typically only remove copper contamination with nitric acid. The current processes are not capable of cleaning non-copper devices and cannot remove the polymer residues derived from the PTFE lining on the carrier devices. PTFE is a combination of carbon and fluoride and is a very tough, uniform material and it is very difficult using normal and conventional chemistries to remove polymeric residues derived from PTFE. In addition, the current back wafer cleaning processes cannot clean the front edge of the wafer held by the carrier devices.

In addition, the prior methods are incapable of dissolving the PTFE defects due to the high chemical stability of the carbon fluorine bond.

SUMMARY OF THE INVENTION

Therefore, a need has arisen for an improved method and apparatus for holding and cleaning the back side of a semiconductor wafer after the CMP process has occurred such that it is capable of removing polymeric defects and other particles from the back side of the wafer and along the front edge of the wafer.

In accordance with the present invention, there is an improved wafer back side cleaning process that utilizes a modified O-ring along the front side of the wafer edge and a new chemistry that is capable of removing the PTFE polymeric defects so that in subsequent cleaning station operations the polymeric residue from the PTFE are not allowed to be exposed to the front side of the wafer and contribute to wafer defects.

More importantly, the new and improved method and process of the present invention utilizes a chemical cleaning solution of a mixture of sulfuric acid, hydrogen peroxide, hydrofluoric and acetic acid in a particular ratio to clean the dielectric wafer surface or utilizes a mixture of nitric acid, hydrofluoric acid, acetic acid and water in a particular ratio for cleaning the copper surface of a semiconductor wafer. The present invention may also use the acetic acid to adjust the fluid viscosity and create a small gap between the semiconductor wafer front and an O-ring or similar sealing device such that there is creep flow or capillary flow of the wet chemicals along approximately 0 mm to 8 mm along the front edge of the wafer.

Another aspect of the present invention is a method for cleaning a semiconductor wafer that includes the step of placing the semiconductor wafer in a cleaning station utilizing a modified chuck such that 0 mm to 8 mm of the front edge of the semiconductor wafer may be exposed to the chemical cleaning solution. Another aspect of the present invention would be to utilize the combination of chemistries utilizing nitric acid, phosphoric acid, hydrofluoric acid and acetic acid in a particular ratio for cleaning the dielectric surface of the wafer.

BRIEF DESCRIPTION OF THE DRAWINGS

For a more complete understanding of the present invention, and the advantages thereof, reference is now made to the following description which is to be taken in conjunction with the accompanying drawings in which like reference numerals indicate like parts and wherein.

DETAILED DESCRIPTION OF THE INVENTION

Figure 1:
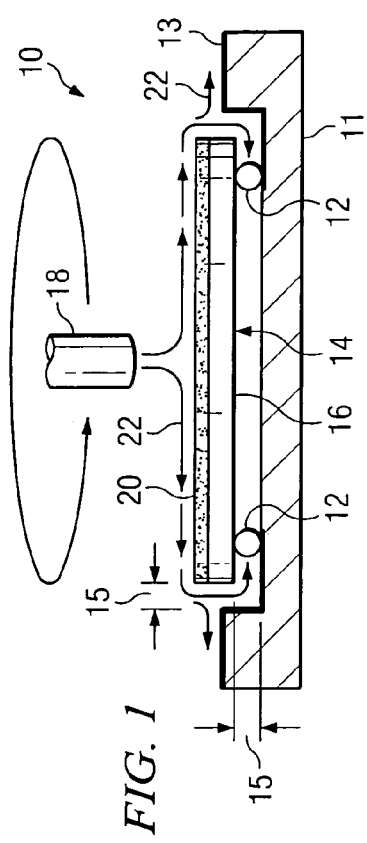
FIG. 1 provides a schematic of a cleaning station of the present invention.
Figure 3A:
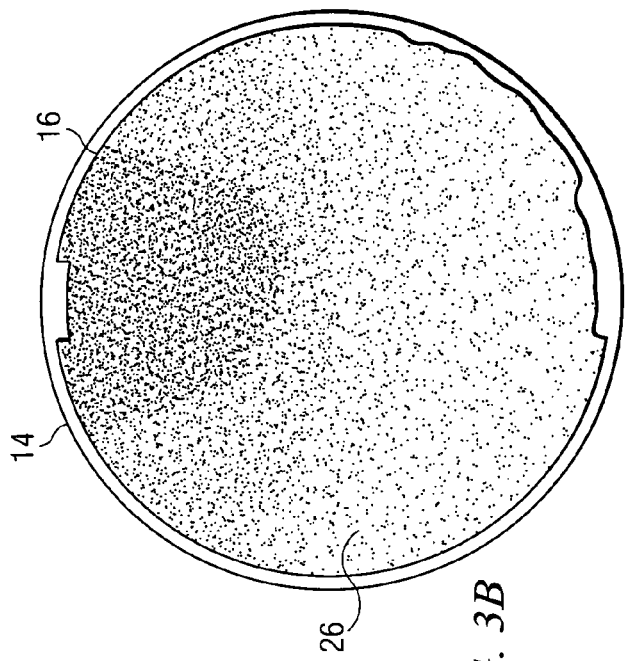
FIG. 3 depicts a semiconductor wafer after the edge polymeric defects are disturbed and relocated by a conventional cleaning process.
Figure 3B:
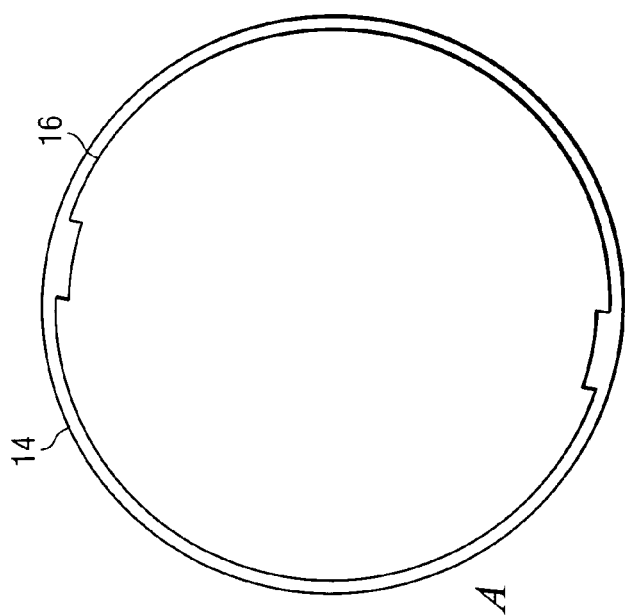

The preferred embodiments and their advantages are best understood by reference to FIGS. 1-5B wherein like numbers are used to indicate like and corresponding parts. Turning now to FIG. 1, therein is disclosed a modified cleaning station 10 of the present invention. The modified cleaning station 10 includes a chuck 11 and a platen 13. Included with the platen 13 is illustrated a sealing device 12 of the present invention. The sealing device 12 may be a modified O-ring. The sealing device 12 may be of any particular material as long as it is operative in the chemical cleaning solution of the present invention. The sealing device 12 preferably is located between 0 mm and 8 mm along a front edge 14 of a semiconductor wafer 16. Consequently, the sealing device 12 may be from 0 mm to 16 mm smaller in diameter than the semiconductor wafer 16.

The platen 13 secures the semiconductor wafer 16 during fabrication processes by vacuum, mechanical attachment or other methods of securing wafers known to those skilled in the art of semiconductor processing. As depicted in FIG. 1, the platen 13 may be countersunk to create a gap 15 between the platen 13 and the semiconductor wafer 16, which is a path for a cleaning solution 18 to reach the front edge 14 of the semiconductor wafer 16. Additionally, the sealing device 12 may slightly elevate the semiconductor wafer 16 above the surface of the platen 13 to create the gap 15. The dimensions of the gap 15 may be adjusted by altering the thickness of the sealing device 12 to promote capillary flow of the cleaning solution 18 between the surface of the platen 13 and the semiconductor wafer 16.

The chemical cleaning solution 18 is injected along the back side 20 of the semiconductor wafer 16 and may utilize any conventional system for its application. In a typical back side clean system, the chuck holds and spins the wafer with the device front side facing down and the clean solution is applied to the wafer backside. During the backside clean, the front side devices are protected by the constant inert gas (such as nitrogen, argon, helium, mixture of inert gas, or air) purge. In the present invention, depending on the makeup of the semiconductor wafer 16, the cleaning station 10 of the present invention is utilized to remove the polymeric defects.

The line 22 shows the wafer rotation that helps to distribute the cleaning solution 18 along the entire back side 20 of the semiconductor wafer 16 and more particularly along both the edge and wafer edge exclusion 14.

In prior solutions the chemical cleaning solution 18 was typically nitric acid, $HNO_3$. The chemical cleaning solution 18 of the cleaning system 10 of the present invention may be a solution of sulfuric acid ($H_2SO_4$), hydrogen peroxide ($H_2O_2$), hydrofluoric acid (HF) and acetic acid ($CH_3COOH$) in a 5:1:1:1 ratio when used for cleaning the dielectric surfaces of wafers 16. The chemical cleaning solution 18 may be a mixture of nitric acid ($HNO_3$), hydrofluoric acid (HF), acetic acid ($CH_3COOH$) and water ($H_2O$) for copper surfaces in a ratio of 7:1:2:5 in another embodiment of the present invention.

The acetic acid ($CH_3COOH$) may be used to adjust the solvent viscosity of the chemical cleaning solution 18 to allow the chemical cleaning solution 18 to enter the gap 15 between the wafer front edge 22 and the sealing device 12 to allow for capillary flow of the chemical cleaning solution 18 to etch an area from 0 mm to 8 mm along the front edge 22 of the wafer 16.

Alternatively, in a different embodiment of the present invention, a chemical solution of nitric acid ($HNO_3$), phosphoric acid ($H_3PO_4$), hydrofluoric acid (HF) and acetic acid ($CH_3COOH$) in a ratio of 6:4:1:1 may also be used to perform the same dissolution of the PTFE around the wafer front edge area 22. One of the advantages of the present invention is that the smaller sealing device 12 of the present invention allows one to expose more of the wafer edge 22 than prior processes.

Figure 2:
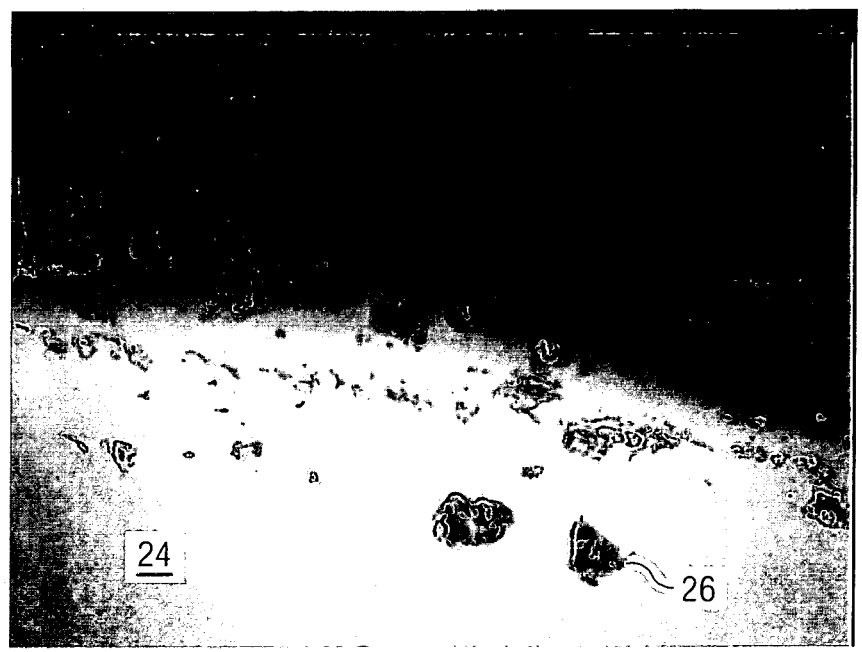
FIG. 2 provides the image of a semiconductor wafer with the defects along the edge.
Figure 3:
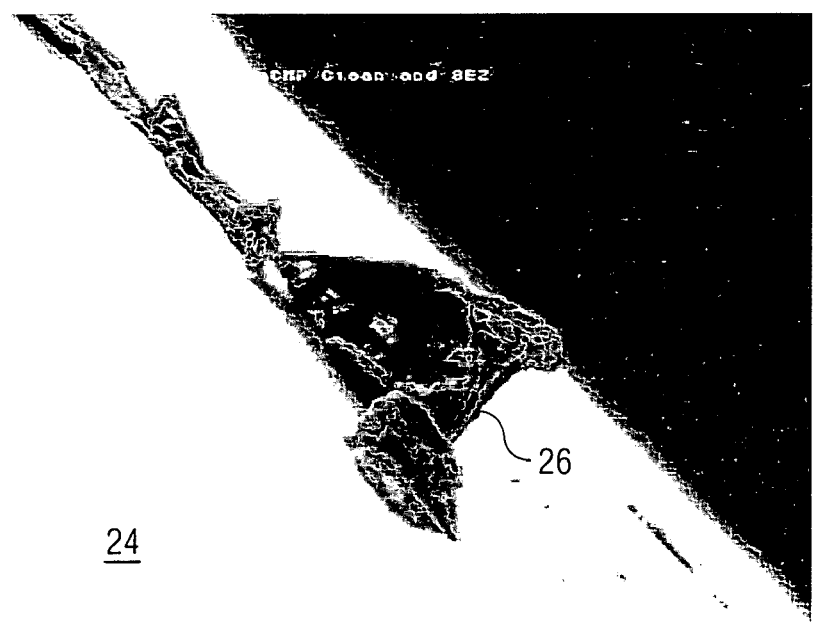

Turning to FIG. 2, therein is shown a semiconductor wafer after the CMP process. Note along the wafer edge 24 numerous particles 26. These particles 26 are fragments of the typical carrier devices and usually are made from PTFE. In the conventional prior art systems when the wafer 24, illustrated in FIG. 2, was cleaned, the particles 26 would scatter across the entire front side of the wafer as illustrated in FIG. 3. These PTFE particles are disturbed and scattered all over the wafer front during the conventional cleaning process such as a baseline pre-interlevel dielectric clean. The polymeric PTFE defects are possibly generated by chemical attack or physical abrasion on the plastic materials, i.e. PTFE, used by the carrier devices in the CMP and subsequent wet clean processes. In the prior art, these PTFE particles 26 are, thus, buried in the dielectric and metal layers and cause yield loss due to Vcc shorts, missing patterns, blocked etch and missing contacts. The prior art wet and dry methods utilizing traditional nitric acid cleaning solutions are ineffective to remove these polymeric PTFE particles 26. It is believed that the PTFE particles are very difficult to remove due to the high chemical stability of the carbon fluorine C:F bond that constitutes the Teflon® coating used in traditional carriers. The present system 10 reduces yield losses from such Vcc shorts, blisters, peeling and other defects caused by the polymeric PTFE particles 26 by removing them before they can be scattered across the front of the wafer itself. The system 10 of the present invention completely removes the PTFE particles 26 thus significantly enhances production yield. In addition, the present invention can be incorporated into current baseline cleaning processes without the use of extra process operation and equipment. Any standard semiconductor fabrication operation equipment may be used with the present invention.

Figure 4A:
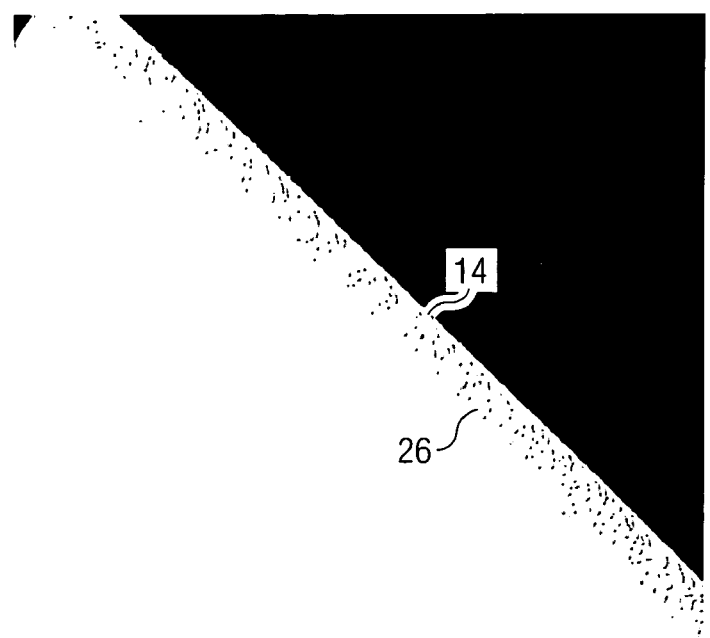
FIG. 4A depicts the polymeric residues on a copper surface before use of the present invention.
Figure 4B:
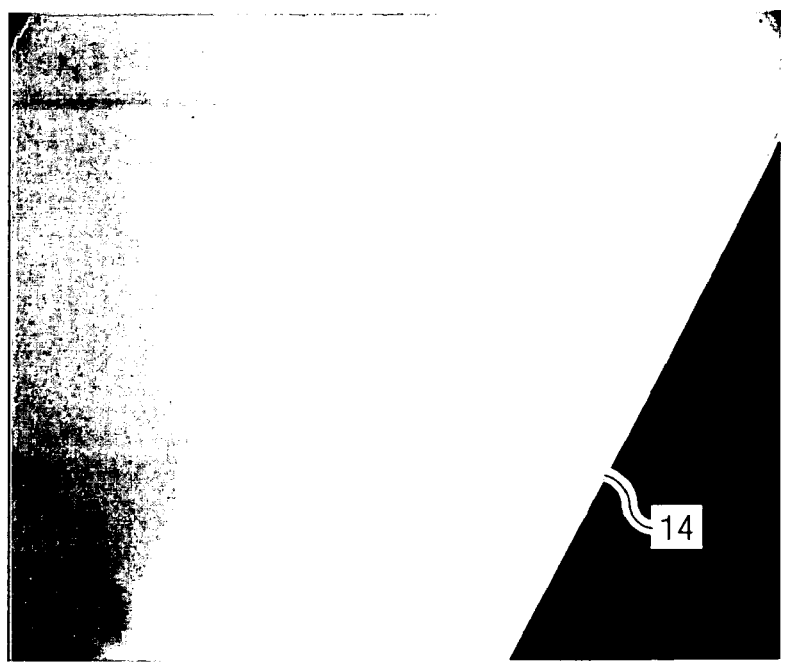
FIG. 4B depicts the semiconductor edge of a copper surface after use of the present invention.

Turning to FIGS. 4A and 4B, these are images of the wafers showing the PTFE particles 26 at the very edge of a typical wafer 16 utilizing microscopy and surfscan to show the images.

Turning now to FIG. 4A, therein is illustrated the surface of a wafer 16 showing the polymeric PTFE particles 26 along the wafer edge 14. This image was produced using microscopy and surfscan.

Turning to FIG. 4B, therein is the same semiconductor wafer 16 and front edge 14 showing that there are now no polymeric PTFE particles 26 after utilizing the method and system of the present invention. FIGS. 4A and 4B show the removal of the PTFE particles 26 from a copper surface semiconductor wafer.

Figure 5A:
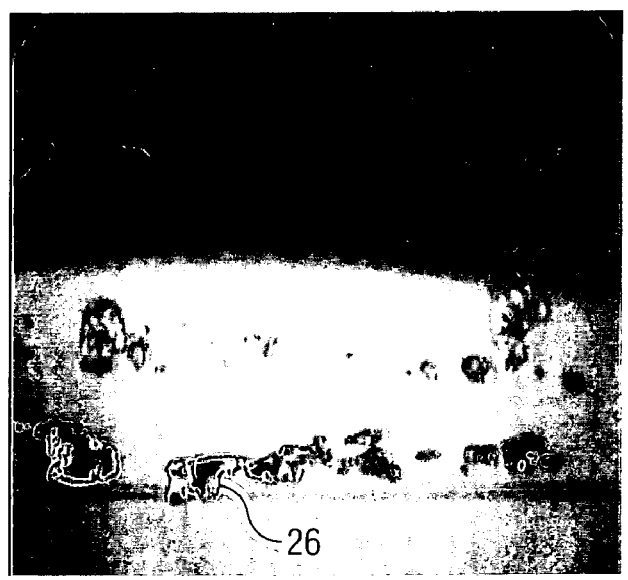
FIG. 5A is an image showing the polymeric residues before the present invention on an oxide surface.
Figure 5B:
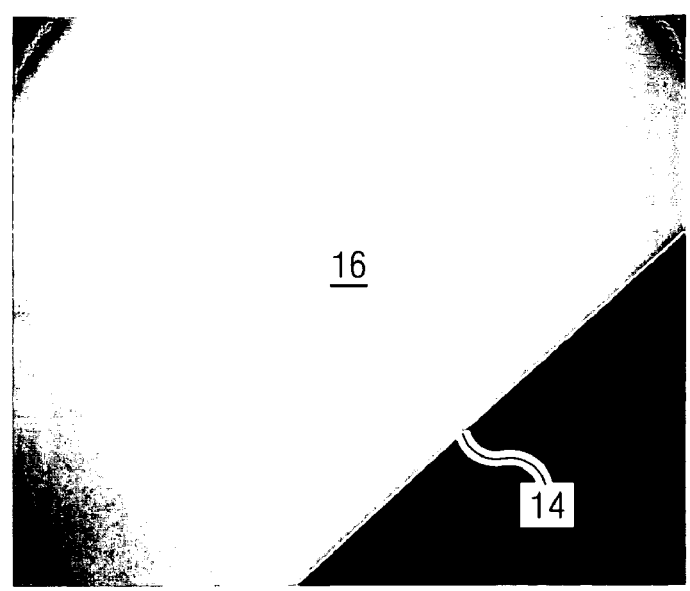
FIG. 5B shows the same oxide surface after use of the present invention.

Turning now to FIG. 5A, therein is shown the polymeric PTFE particles 26 on the wafer 16 and along its front edge 14 from a typical oxide surface of a semiconductor wafer before use of the present invention. The image in FIG. 5B shows the removal of all PTFE particles 26 from the oxide surface utilizing the present invention.

It should be noted that any chemical cleaning solution utilizing the present invention that is capable of dissolving and removing the PTFE particles and, in particular, breaking the C:F bond is capable of being used in the present invention. In addition, the ratios of the present chemical cleaning solutions may also be changed without departing from the invention itself.

Although the invention has been described in detail herein with reference to the illustrative embodiments, it is to be understood that this description is by way of example only and is not to be construed in a limiting sense. It is to be further understood that numerous changes in the details of the embodiments of the invention and additional embodiments of the invention will be apparent to and may be made by persons of ordinary skill in the art having reference to this description. It is contemplated that all such changes and additional embodiments are within the spirit and true scope of the invention as claimed below.

What is claimed is:

1. A method for cleaning a semiconductor device, comprising the steps of:
    securing a wafer frontside down with a modified chuck, said wafer having PTFE (polytetrafluoroethylene) particles thereon;
    applying a cleaning solution comprising an acid to the backside of the wafer, the cleaning solution capable of removing PTFE from the wafer; and
    distributing the cleaning solution along the entire backside of the wafer and around the edge of the wafer to remove said PTFE particles.

2. The method of claim 1, further comprising the step of applying the cleaning solution to at least a portion of the front of the wafer.

3. The method of claim 2, wherein the cleaning solution is applied to at least a portion of the front of the wafer by capillary action between the front of the wafer and the chuck.

4. The method of claim 1, wherein the chuck has an O-ring to create a gap between the chuck and the wafer, the O-ring having a smaller diameter than the diameter of the wafer.

5. The method of claim 4, wherein the diameter of the O-ring is between about 0 mm and 16 mm smaller in diameter than the wafer.

6. A method for cleaning a semiconductor device, comprising the steps of:
    securing a wafer frontside down with a modified chuck, said wafer having PTFE (polytetrafluoroethylene) particles thereon;
    applying a cleaning solution to the backside of the wafer, the cleaning solution capable of removing PTFE from the wafer; and
    distributing the cleaning solution along the entire backside of the wafer and around the edge of the wafer to remove said PTFE particles, wherein the cleaning solution comprises a solution of sulfuric acid ($H_2SO_4$), hydrogen peroxide ($H_2O_2$), hydrofluoric acid (HF) and acetic acid ($CH_3COOH$).

7. The method of claim 6, wherein the cleaning solution comprises a solution of sulfuric acid ($H_2SO_4$), hydrogen peroxide ($H_2O_2$), hydrofluoric acid (HF) and acetic acid ($CH_3COOH$) in a 5:1:1:1 ratio.

8. A method for cleaning a semiconductor device, comprising the steps of:
    securing a wafer frontside down with a modified chuck, said wafer having PTFE (polytetrafluoroethylene) particles thereon;
    applying a cleaning solution to the backside of the wafer, the cleaning solution capable of removing PTFE from the wafer; and
    distributing the cleaning solution along the entire backside of the wafer and around the edge of the wafer to remove said PTFE particles, wherein the cleaning solution comprises a solution of nitric acid ($HNO_3$), hydrofluoric acid (HF), acetic acid ($CH_3COOH$) and water ($H_2O$).

9. The method of claim 8, wherein the cleaning solution comprises a solution of nitric acid ($HNO_3$), hydrofluoric acid (HF), acetic acid ($CH_3COOH$) and water ($H_2O$) in a 7:1:2:5 ratio.

10. The method of claim 6, further comprising the step of applying the cleaning solution to at least a portion of the front of the wafer.

11. The method of claim 10, wherein the cleaning solution is applied to at least a portion of the front of the wafer by capillary action between the front of the wafer and the chuck.

12. The method of claim 6, wherein the chuck has an O-ring to create a gap between the chuck and the wafer, the O-ring having a smaller diameter than the diameter of the wafer.

13. The method of claim 12, wherein the diameter of the O-ring is between about 0 mm and 16 mm smaller in diameter than the wafer.

14. The method of claim 8, further comprising the step of applying the cleaning solution to at least a portion of the front of the wafer.

15. The method of claim 14, wherein the cleaning solution is applied to at least a portion of the front of the wafer by capillary action between the front of the wafer and the chuck.

16. The method of claim 8, wherein the chuck has an O-ring to create a gap between the chuck and the wafer, the O-ring having a smaller diameter than the diameter of the wafer.

17. The method of claim 16, wherein the diameter of the O-ring is between about 0 mm and 16 mm smaller in diameter than the wafer.

* * * * *